United States Patent

Griffing

[15] 3,641,367

[45] Feb. 8, 1972

[54] PULSE DRIVING CIRCUIT FOR INDUCTIVE LOAD

[72] Inventor: Brandt M. Griffing, Delray Beach, Fla.

[73] Assignee: International Business Machines Corporation, Armonk, N.Y.

[22] Filed: Dec. 24, 1970

[21] Appl. No.: 101,232

[52] U.S. Cl.....................307/252 J, 307/252 K, 307/252 M, 307/268

[51] Int. Cl.....................................H03k 17/00, H03k 17/56

[58] Field of Search.............307/252 H, 252 J, 252 K, 252 L, 307/252 M, 252 W, 268, 270, 284

[56] References Cited

UNITED STATES PATENTS 3,205,378 9/1965 Kline..................................307/252 K 3,243,665 3/1966 Fayer et al. ..........................307/252 J 3,309,535 3/1967 Sutherland et al. .................307/252 K 3,396,293 8/1968 Harris .................................307/252 K

*Primary Examiner*—Donald D. Forrer

*Assistant Examiner*—John Zazworsky

*Attorney*—Sughrue, Rothwell, Mion, Zinn & Macpeak

[57] ABSTRACT

A circuit for providing constant width driving pulses to a plurality of selected print hammer coils from a single DC source. An RC circuit is used to commutate a controlled rectifier in series with the hammer coils in order quickly to terminate the current through each coil after actuation of its print hammer, thereby providing for high-speed operation of the hammers.

6 Claims, 4 Drawing Figures

INVENTOR
BRANDT M. GRIFFING
BY Sughrue, Rothwell, Mion, Zinn & Macpeak
ATTORNEYS

PULSE DRIVING CIRCUIT FOR INDUCTIVE LOAD

BACKGROUND OF THE INVENTION

1. Field of the Invention

This invention relates generally to circuits for providing pulses to inductive loads from a single power source and more particularly to such a circuit employing controlled rectifiers which are commutated to provide pulses in accordance with a predetermined duty cycle.

2. Description of the Prior Art

Prior art circuits employing controlled rectifiers for producing pulses are disclosed in the following publications:

1. U.S. Pat. No. 3,341,767–Cielo, assigned to the assignee of the present invention.

2. "Multiple Pulse Generating Circuit With Common Discharge Path" by B. M. Griffing, *IBM Technical Disclosure Bulletin*, Vol. 13, No. 2, July 1970, pp. 339–340.

3. "Power Pulse Firing Circuit" by B. M. Griffing and J. Saia, *IBM Technical Disclosure Bulletin*, Vol. 13, No. 2, July 1970, pp. 341–342.

4. The Morgan circuit shown in FIG. 10.5, p. 323, of *Principles of Inverter Circuits*, Bedford and Hoft, John Wiley and Sons, Inc., 1964.

A problem in the prior art has been providing high-speed repetitive energization of selected ones of a plurality of inductive loads, such as high-speed print hammer actuating coils. The inductance of these coils prevented them from being deenergized quickly enough to assure reliable operation on a subsequent operation cycle.

SUMMARY OF THE INVENTION

The broad object of the invention is to provide a power pulsing circuit including a controlled rectifier and means for commutating the controlled rectifier in accordance with a predetermined duty cycle.

Another object of the invention is to provide such a power pulsing circuit for selectively operating at high speed a plurality of parallel-connected print hammer coils from a common DC power source.

Another object is to eliminate the need for a high-voltage switch in the transformer primary circuit of an inductive load driving circuit employing silicon controlled rectifiers.

These objects are accomplished in one form of the invention by providing a silicon controlled rectifier (SCR) in series with an inductive load and connected to a timing capacitor which is charged while the load is being energized by a driving pulse derived from a DC source. Connected to the timing capacitor is a commutating SCR which is turned on at a predetermined time after the load is energized to connect the timing capacitor across the line SCR, thereby back biasing and turning it off so that current flow through the inductive load is quickly and positively terminated.

DESCRIPTION OF THE PREFERRED EMBODIMENT

Figures 1, 2:
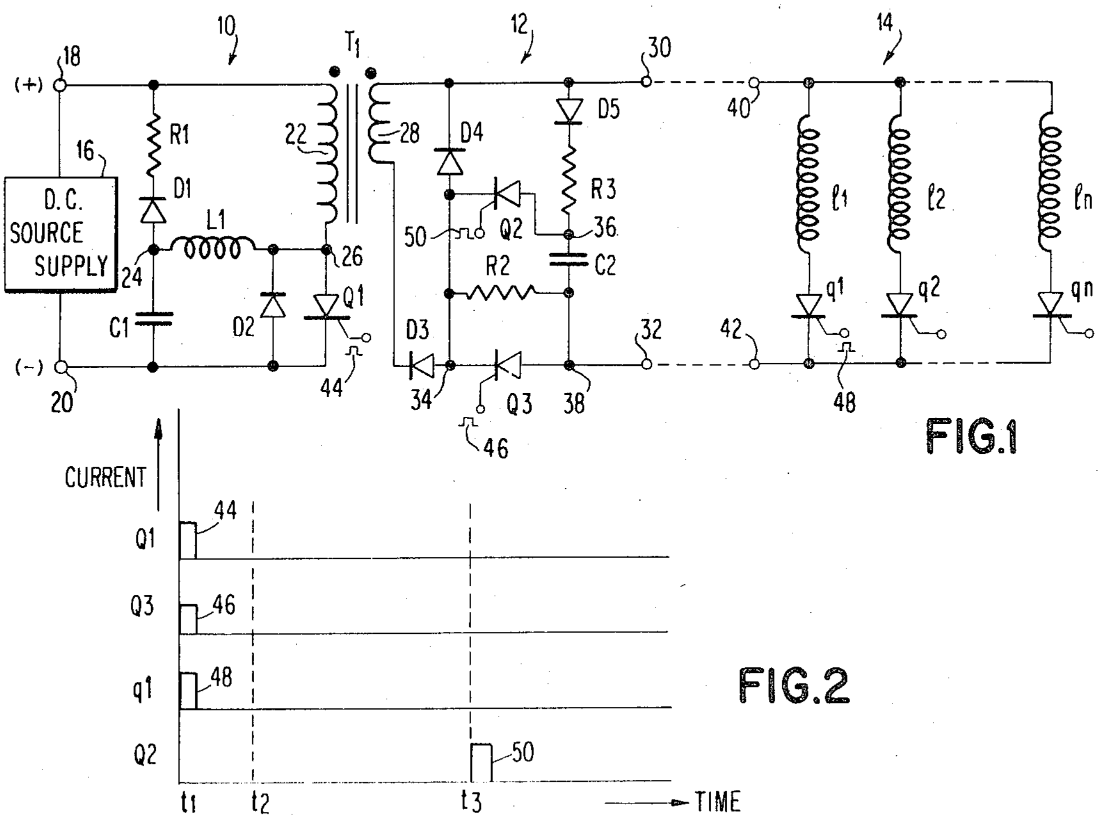
FIG. 1 is a schematic circuit diagram of a preferred form of the invention.
FIG. 2 is a diagram showing the gate pulses for the SCR's in FIG. 1.

A schematic diagram of the preferred form of the pulse power supply circuit is illustrated in FIG. 1 and consists of three sections: a primary circuit 10, a secondary circuit 12, and a load circuit 14. A bulk DC source 16 is connected across the input terminals 18 and 20 of the primary circuit 10. Also connected across the terminals 18 and 20 is a controlled rectifier $Q_1$ in series with the primary winding 22 of a step down gapped transformer $T_1$. The controlled rectifiers illustrated in the circuit diagram are preferably silicon controlled rectifiers. Also connected across the input terminals 18 and 20 is a series circuit consisting of a resistor $R_1$, a diode $D_1$ and a capacitor $C_1$. Connected between the junction 24 of rectifier $D_1$ and capacitor $C_1$ and the junction 26 of primary winding 22 and the anode of SCR $Q_1$ is an inductor $L_1$ having a square loop iron core. Connected between the junction 26 and input terminal 20 across SCR $Q_1$ is a diode $D_2$.

The secondary circuit 12 comprises the secondary winding 28 of transformer $T_1$ connected across output terminals 30 and 32. Connected in series with the secondary winding 28 between the lower end of output terminal 32 are a diode $D_3$ and a line SCR $Q_3$. SCR $Q_3$ is effectively in series with the load circuit 14. Connected across the secondary winding 28 between output terminal 30 and the junction 34 of diode $D_3$ and SCR $Q_3$ is a diode $D_4$. Connected in series across the output terminal of 30 and 32 are a diode $D_5$, a resistor $R_3$ and a timing capacitor $C_2$. Connected between the junction 34 and the junction 36 of resistor $R_3$ and capacitor $C_2$ is a commutating SCR $Q_2$. A resistor $R_3$ is connected between the junction 34 and the junction 38 of capacitor $C_2$ and the anode of SCR $Q_3$.

Adapted to be connected across the output terminals 30 and 32 of secondary circuit 12 is an inductive load circuit 14 consisting of a plurality of parallel-connected inductive loads $l_1, l_2, \ldots l_n$. These load circuits are connected across terminals 40 and 42 which are adapted to be connected to the output terminals 30 and 32, respectively, Connected in series with the inductive loads $l_1, l_2 \ldots l_n$ are individual SCR's $q_1, q_2, \ldots q_n$, respectively. In a particular application of this invention, the inductive loads $l_1, l_2, \ldots l_n$ are four print hammer actuator coils of a high-speed printer.

Figure 3:
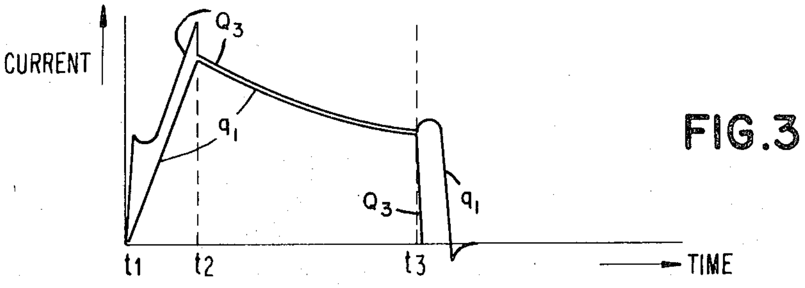
FIG. 3 is a graph showing the current flow in the circuit of FIG. 1.

The operation of a circuit of FIG. 1 will be described with respect to the SCR gate pulse diagram shown in FIG. 2 and the line SCR $Q_3$ current illustrated in FIG. 3. Capacitor $C_1$ is initially charged to the source voltage through the primary winding 22 and the inductor $L_1$. For example, it it is desired to energize the print hammer coil $l_1$, then relatively short gate pulses 44, 46, and 48 are applied simultaneously to the gate electrodes of SCR's $Q_1$, $Q_3$, and $q_1$, respectively. It is to be understood that gate pulses 48 may also be simultaneously applied to the gate electrodes of any of the other hammer coils $l_2 \ldots l_n$ which it is desired to energize.

The application of the gate pulses turns on, i.e., renders conducting, the corresponding SCR's. DC source 16 is a bulk DC voltage source whose voltage is applied across the primary winding 22 of transformer $T_1$ so that current begins to flow through this winding and the conducting series-connected SCR $Q_1$. All the SCR's are of the type which, once they are rendered conducting, continue to conduct even though the gate pulse is removed until the SCR is reverse biased, or the current passing through it drops below the value sufficient to maintain conduction. The output voltage initially appearing across terminals 30 and 32 is substantially equal to the voltage of the DC source 16 times the turns ratio of the step down transformer $T_1$ less the voltage drops in the various diodes and causes a load current to flow through a path consisting of load $l_1$, SCR $q_1$, SCR $Q_3$ and diode $D_3$. The ringing action of the resonant $L_1C_1$ circuit commutates or turns SCR $Q_1$ off by back-biasing SCR $Q_1$. This LC commutating action is well known in the prior art as the Morgan circuit. When the voltage across capacitor $C_1$ reverses due to this ringing action, current flows through diode $D_2$ to apply reverse voltage of about −0.6 volt across SCR $Q_1$, thereby turning off $Q_1$.

During the time that $Q_1$ is conducting, the timing capacitor $C_2$ in the secondary circuit is charging through the diode $D_5$ and the resistor $R_3$ toward the secondary voltage appearing across the secondary winding 28, and current is also increasing through the hammer coil $l_1$ and in the series connected SCR $Q_3$. For a source voltage 300 volts, and a turns ratio of 1:6, the initial secondary voltage is approximately 50 volts, and the capacitor $C_2$ charges to about 35 volts. After SCR $Q_1$ is turned off at time $t_2$, the transformer $T_1$ begins flux resetting with the energy in its collapsing magnetic field being dissipated in resistor $R_1$. The lower end of primary winding rises to about 100 volts above the source voltage, and the voltage across secondary winding reverses. Diode $D_3$ prevents load current from flowing in the reverse direction, and the collapsing magnetic field of load $l_1$ maintains load current flow in the initial direction through a path including SCR $Q_3$ and diode $D_4$, the load voltage dropping close to zero volts.

Since it is desired to quickly terminate load current flowing through the hammer coil $l_1$ in series with SCR $q_1$ and SCR $Q_3$, SCR $Q_2$ is turned on by the application of a gate pulse 50 to the gate electrode of SCR $Q_2$. In a typical print hammer application, SCR $Q_2$ is turned on at time $t_3$, approximately 400 microseconds after SCR $Q_1$ turns off.

When SCR $Q_2$ is turned on, the voltage across capacitor $C_2$ is applied across the cathode-anode circuit of SCR $Q_3$, thereby reverse-biasing SCR $Q_3$ and turning it off.

The load current then continues to flow through SCR $q_1$, capacitor $C_2$, SCR $Q_2$ and diode $D_4$. The LC circuit formed by the inductance of the hammer coil $l_1$ and the capacitance of the timing capacitor $C_2$ then resonates or rings to initially apply the capacitor voltage (35 volts) across load $l_1$, and then to cause the capacitor voltage to reverse and back-bias SCR $q_1$ to turn it off. Any energy left in timing capacitor $C_2$ is then dissipated in the discharge path including resistors $R_2$, $D_4$, $D_5$ and $R_3$. Of course, if more than one of the inductive loads $l_1, l_2 \ldots l_n$ are energized because a respective series-connected SCR $q_1$, $Q_2, \ldots q_n$ has been gated on, then all such inductances ring with the capacitor $C_2$ so that their respective SCR's $q_1, q_2, \ldots q_n$ are commutated off in the same manner as just described for the SCR $q_1$. The load driving cycle is then terminated, and another cycle may be initiated by gating on SCR's, $Q_1$ and $Q_3$ and one or more of the SCR's $q_1, q_2 \ldots q_n$. A typical cycle time is 1 millisecond. The selected loads $l_1, l_2 \ldots l_n$ are thus provided with unidirectional pulses of constant duration without the need for a high-voltage switch in the primary circuit of transformer $T_1$.

An alternative approach to the circuit of FIG. 1 would be to make the primary of the transformer $T_1$ an autotransformer. The disadvantage of this approach is the high voltage rating which would be required for SCR $Q_1$.

The improved pulse driving circuit permits high-speed operation of the hammer coils $l_1, l_2 \ldots l_n$. In the prior art, high-speed apparatus was not available because the inductance of the loads $l_1, l_2 \ldots l_n$ would cause load current to flow through the SCR's $q_1, q_2 \ldots q_n$ even after the drive pulse had been terminated. Since the SCR's might still be conducting when the next driving cycle was initiated, an undesired hammer coil would be energized. The present circuit provides reliable high-speed operation by assuring that the SCR's $q_1, q_2 \ldots q_n$ are turned off positively and quickly.

An exemplary set of values for the components illustrated in FIG. 1 are as follows:

Source 16=300 volts
Resistor $R_1$=100 to 400 ohms
$C_1$=2 microfarads
$R_2$=10 ohms
$R_3$=10 ohms
$C_2$=25 microfarads
$l_1=l_2=l_n$=0.5 millihenry Furthermore, the saturated inductance of $L_1$ is very much less than the inductance of the primary winding 22.

Figure 4:
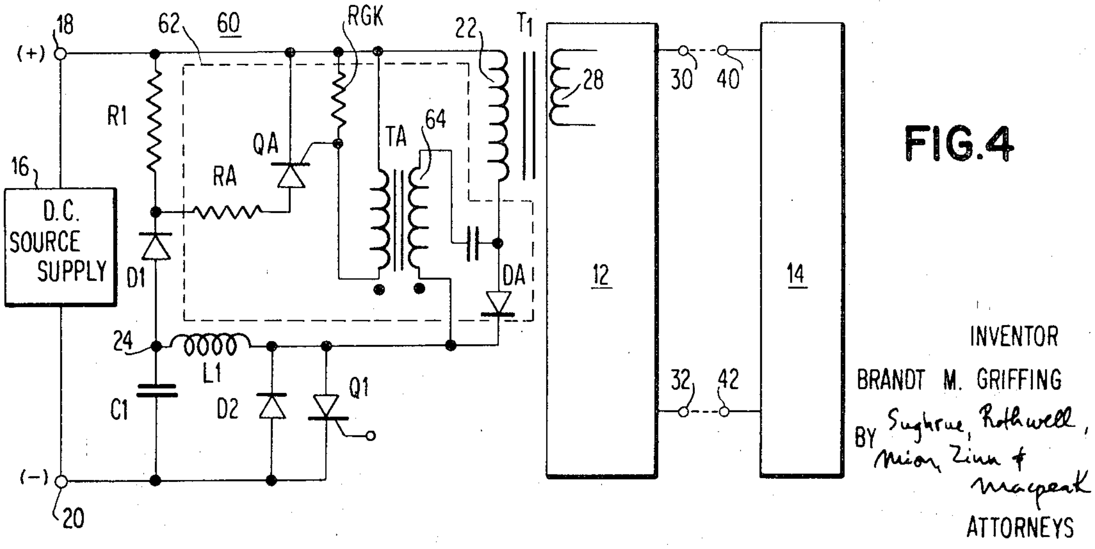
FIG. 4 is a schematic circuit diagram of another embodiment of the invention.

Another embodiment of the invention is illustrated in FIG. 4. Corresponding components in FIGS. 1 and 4 have been designated by the same reference symbols. FIG. 4 illustrates an improvement in the primary circuit 10, and the secondary circuit 12 and the load circuit 14 are identical to those illustrated in FIG. 1 and described above.

In FIG. 4, the primary circuit 10 of FIG. 1 has been replaced by a modified primary circuit 60. Primary circuit 60 differs from primary circuit 10 in that a feedback circuit 62 has been added to the primary circuit in FIG. 4. This feedback circuit includes diode $D_A$ connected between the lower end of the transformer primary winding 22 and the anode of the SCR $Q_1$. Connected across diode $D_A$ is the primary winding 64 of a pulse transformer $T_A$. The secondary winding 66 of transformer $T_A$ is connected to the gate electrode of an SCR $Q_A$ which is connected in primary with a resistor $R_A$ which has a value of about 10 ohms. The series combination of the SCR $Q_A$ and the resistor $R_A$ is connected across the resistor $R_1$. $R_{GK}$ is the gate-to-cathode resistor for SCR $Q_A$.

The purpose of the resistor $R_1$ in both FIG. 1 and FIG. 4 is to dissipate the energy stored in transformer $T_1$ when the transformer flux is resetting after SCR $Q_1$ turns off. If sufficient time is provided for resetting the transformer $T_1$, then resistor $R_1$ can be small enough to assure that current always flows in one direction (right to left) through inductance $L_1$. If the available transformer reset time is decreased, for higher operating speeds, i.e., shorter cycle times, then resistor $R_1$ must be increased so as to provide the necessary resetting voltage, to permit the primary winding 22 to reset or discharge more quickly. However, without the improvement of FIG. 4, an increase in the value of resistor $R_1$ increases the voltage on capacitor $C_1$ to a value above the voltage of source 16 by an appreciable amount, thereby causing the current direction in inductor $L_1$ to reverse after the flux in transformer $T_1$ has reset, with the result that the pulse widths of the output pulses from secondary circuit 12 are shorter than is the case with the lower valued resistor $R_1$. In addition the pulse width is quite unpredictable.

With the improvement illustrated in FIG. 4, the value of resistor $R_1$ can be made as large as necessary to assure resetting of the transformer $T_1$. The diode $D_A$ assures that the capacitor $C_1$ cannot discharge through inductor $L_1$ and the primary winding 22 of transformer $T_1$. Furthermore, when transformer $T_1$ is reset, the voltage on the cathode of diode $D_A$ increases with respect to the voltage on the anode thereof, thus producing a positive pulse which is coupled through the feedback pulse transformer to the gate electrode of SCR $Q_A$, thereby firing SCR $Q_A$. The resistor $R_A$ then allows the charge of capacitor $C_1$ to flow back to the positive terminal 18 of the DC source 16, the values of $R_A$ and $C_1$ being chosen such that the product $R_A C_1$ is small so that the discharge occurs quickly. Thus, the voltage on capacitor $C_1$ and the magnetic state of inductor $L_1$ are constant from cycle to cycle, and, therefore, the primary circuit 60 provides truly constant volt-time products.

The advantages of the improved pulse driving circuits described above are that they provide unidirectional current pulses of fixed duration to a print hammer coil or other inductive load while eliminating the need for a high-voltage switch in the primary circuit of the pulse transformer $T_1$. Furthermore, the invention provides a common pulse supply circuit for driving a plurality of parallel-connected inductive loads which may be selectively switched for energization by the drive pulses produced by the circuit. In addition, the circuit provides higher speed operation of the inductive load than was available in the prior art.

An alternative approach to the circuit of FIG. 1 would be to make the primary of transformer $T_1$ an autotransformer, thus providing a positive current source for loads $l_1, l_2 \ldots l_n$ and additionally providing a negative or back biasing source to guarantee turnoff of SCR's $q_1, q_2 \ldots q_n$. This approach requires a high-voltage rating for SCR $Q_1$ and an additional SCR to complete the circuit for the autotransformer.

While the invention has been particularly shown and described with reference to the preferred embodiments thereof, it will be understood by those skilled in the art that various changes in form and details may be made therein without departing from the spirit and scope of the invention.

I claim:

1. A pulse driving circuit for an inductive load comprising:
a. a transformer having a primary winding and a secondary winding,
b. a first normally nonconducting controlled rectifier connected in series with said primary winding,
c. a first LC ringing circuit connected to said first controlled rectifier, and comprising:

1. a first rectifier connected across said first controlled rectifier, and
2. a first inductor and a first capacitor connected in series across said first rectifier, d. means for applying a DC voltage across the series combination of said primary winding and said first controlled rectifier;
e. a load circuit comprising an inductive load and a second normally nonconducting controlled rectifier connected in series across said secondary winding,
f. an RC circuit comprising a first resistor and a second capacitor connected in series across said second winding,
g. a third normally nonconducting controlled rectifier connected in series with said secondary winding and said load circuit,
h. a fourth normally nonconducting controlled rectifier connected between said second capacitor and said third controlled rectifier, and
i. means for simultaneously applying momentary gating pulses to the gate electrodes of said first, second and third controlled rectifiers to render them conducting, so that a unidirectional load driving pulse is produced in said primary winding and induced in said secondary winding to cause unidirectional load current to flow through said load circuit and said third controlled rectifier, and to cause said second capacitor to charge to a commutating voltage, whereby the resultant ringing action of said first LC circuit renders said first controlled rectifier nonconducting, and
j. means for applying a momentary gating pulse to the gate electrode of said fourth controlled rectifier after said first controlled rectifier has become nonconducting, said that the commutating voltage on said second capacitor renders said third controlled rectifier nonconducting, whereby said second capacitor and said inductive load form a second LC circuit whose ringing action then renders said second controlled rectifier nonconducting.

2. A pulse driving circuit as defined in claim 1 wherein said load circuit further comprises a plurality of additional inductive loads connected in series with corresponding additional second controlled rectifiers across said secondary winding, and means for applying momentary gate pulses to the gate electrodes of selected ones of said additional controlled rectifiers simultaneously with the application of the gate pulses to said first, second and third controlled rectifiers, so that said unidirectional load current also flows through the additional inductive loads corresponding to said selected additional controlled rectifiers, whereby said second capacitor forms additional LC ringing circuits with the selected additional inductive loads to render said selected corresponding additional controlled rectifiers nonconducting.

3. A pulse driving circuit as defined in claim 1 further comprising a second resistor coupled to said primary winding and to said first capacitor for dissipating the magnetic energy stored in said primary winding after said first controlled rectifier is rendered nonconducting and for discharging said first capacitor to the value of said DC voltage.

4. A pulse driving circuit as defined in claim 3 further comprising a second rectifier connected in series with said primary winding and poled to block ringing current from said first LC current from flowing through said first inductor and said primary winding in a direction opposite to said driving pulse.

5. A pulse driving circuit as defined in claim 4 further comprising a shunting circuit connected between said second resistor and said second rectifier, said shunting circuit comprising:

a. a normally nonconducting fifth controlled rectifier and a third resistor connected in series across said second resistor,
b. said third resistor having an ohmic value lower than said second resistor, and
c. means coupling the gate electrode of said fifth controlled rectifier to the junction of said second rectifier and said primary winding, so that, when the energy in said primary winding has been dissipated, the charge on said first capacitor renders said fifth controlled rectifier conducting, whereby said first capacitor discharges through said third resistor.

6. A pulse driving circuit for an inductive load comprising:

a. a transformer having a primary winding and a secondary winding;
b. a load circuit comprising a plurality of inductive devices connected in parallel across said secondary winding;
c. a plurality of individual normally nonconducting gate-controlled rectifiers, each connected in series with a different one of said inductive devices;
d. an RC circuit comprising a resistor and a capacitor connected in series across said secondary winding;
e. a secondary, normally nonconducting gate-controlled rectifier connected in series with said secondary winding and said load circuit;
f. a commutating normally nonconducting gate-controlled rectifier connected between said capacitor and said secondary controlled rectifier;
g. means for simultaneously applying a direct current pulse through said primary winding and respective momentary gating pulses to the gate electrodes of said secondary controlled rectifier and of selected ones of said individual controlled rectifiers to render conducting said secondary and said selected individual controlled rectifiers, so that a unidirectional load driving pulse is induced in said secondary winding from said primary winding to cause unidirectional load current to flow through said secondary controlled rectifier and through the inductive devices connected in series with said selected individual controlled rectifiers, and to cause said capacitor to charge to a commutating voltage; and
h. means for applying a momentary gating pulse to the gate electrode of said commutating controlled rectifier after said direct current pulse in said primary winding has terminated to render conducting said commutating controlled rectifier, so that the commutating voltage on said capacitor renders said secondary controlled rectifier nonconducting, whereby said capacitor and said inductive devices carrying load current form an LC circuit whose ringing action then renders nonconducting said selected individual controlled rectifiers.

* * * * *

UNITED STATES PATENT OFFICE
CERTIFICATE OF CORRECTION

Patent No. 3,641,367 Dated February 8, 1972

Inventor(s) B. M. Griffing

It is certified that error appears in the above-identified patent and that said Letters Patent are hereby corrected as shown below:

IN THE SPECIFICATION

Col. 4, Line 5 Delete "primary" insert--series--

Signed and sealed this 4th day of July 1972.

(SEAL)
Attest:

EDWARD M.FLETCHER, JR.
Attesting Officer

ROBERT GOTTSCHALK
Commissioner of Patents

USCOMM-DC 60376-P69
☆ U.S. GOVERNMENT PRINTING OFFICE : 1969 O—366-334